US012695061B2

(12) United States Patent
Kozakevich et al.

(10) Patent No.: US 12,695,061 B2
(45) Date of Patent: Jul. 28, 2026

(54) IMPEDANCE MATCH WITH AN ELONGATED RF STRAP

(71) Applicant: Lam Research Corporation, Fremont, CA (US)

(72) Inventors: Felix Leib Kozakevich, Sunnyvale, CA (US); Alexei Marakhtanov, Albany, CA (US); Bing Ji, Pleasanton, CA (US); Ranadeep Bhowmick, San Jose, CA (US); John Holland, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 189 days.

(21) Appl. No.: 18/791,152

(22) Filed: Jul. 31, 2024

(65) Prior Publication Data

US 2024/0395504 A1     Nov. 28, 2024

Related U.S. Application Data

(63) Continuation of application No. 17/795,225, filed as application No. PCT/US2021/013111 on Jan. 12, 2021, now Pat. No. 12,080,518.

(60) Provisional application No. 62/967,992, filed on Jan. 30, 2020.

(51) Int. Cl.
*H03H 7/38* (2006.01)
*H01J 37/32* (2006.01)

(52) U.S. Cl.
CPC .. *H01J 37/32183* (2013.01); *H01J 37/32577* (2013.01); *H03H 7/38* (2013.01)

(58) Field of Classification Search
CPC .......... H03H 7/38; H03H 7/40; H03H 9/0004; H03H 9/00; H03H 11/28; H01J 37/32183
USPC ....................................................... 333/17.3
See application file for complete search history.

(56) References Cited

U.S. PATENT DOCUMENTS 12,080,518 B2 *   9/2024   Kozakevich ...... H01J 37/32577
12,165,844 B2 *  12/2024   Marakhtanov .... H01J 37/32183

* cited by examiner

*Primary Examiner* — Hai L Nguyen
(74) *Attorney, Agent, or Firm* — Polygon IP, LLP

(57) ABSTRACT

An impedance match is described. The impedance match includes a housing having a bottom portion and a top portion. The bottom portion has match components and the top portion has an elongated body. A low frequency input is connected through the bottom portion of the housing, and the low frequency input is interconnected to a first set of capacitors and inductors. A high frequency input is connected through the bottom portion of the housing, and the high frequency input is interconnected to a second set of capacitors and inductors. An elongated strap extends between the bottom portion and the top portion of the housing. A lower portion of the elongated strap is coupled to the second set of capacitors and inductors and an upper portion of the elongated strap is connected to an RF rod at an end of the elongated body.

23 Claims, 8 Drawing Sheets

(Match with RF straps)

IMPEDANCE MATCH WITH AN ELONGATED RF STRAP

CLAIM OF PRIORITY

This application is a continuation of and claims priority, under 35 U.S.C. § 120, to U.S. patent application Ser. No. 17/795,225, filed on Jul. 25, 2022, and titled "IMPEDANCE MATCH WITH AN ELONGATED RF STRAP", which claims priority, under 35 U.S.C. § 371, to PCT/US21/13111, filed on Jan. 12, 2021, and titled "IMPEDANCE MATCH WITH AN ELONGATED RF STRAP", which claims the benefit of and priority, under 35 U.S.C. § 119(e), to U.S. Provisional Patent Application No. 62/967,992, filed on Jan. 30, 2020, and titled "IMPEDANCE MATCH WITH AN ELONGATED RF STRAP", all of which are incorporated by reference herein in their entirety.

FIELD

The embodiments described in the present disclosure relate to an impedance matching circuit system having an elongated radio frequency (RF) strap.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A radiofrequency (RF) generator generates an RF signal and supplies the RF signal via a match to a plasma reactor. The plasma reactor has a semiconductor wafer that is etched when the RF signal is supplied and an etchant gas is supplied to the plasma reactor. However, it is desirable that the match meet certain pre-set constraints.

It is in this context that embodiments described in the present disclosure arise.

SUMMARY

Embodiments of the disclosure provide an impedance matching circuit system having an elongated radio frequency (RF) strap. It should be appreciated that the present embodiments can be implemented in numerous ways, e.g., a process, an apparatus, a system, a piece of hardware, or a method on a computer-readable medium. Several embodiments are described below.

In one embodiment, an impedance match for transferring RF power to an electrode of a plasma chamber is provided. A housing having a bottom portion and a top portion is provided. The bottom portion has match components and the top portion has an elongated body. An elongated strap extends between the bottom portion and the top portion of the housing, and a lower portion of the elongated strap is coupled to match components. An upper portion of the elongated strap is connected to an RF rod at an end of the elongated body. An intermediate strap is coupled at a first end to the elongated strap at a mid-connection that is between the lower portion and the upper portion. The intermediate strap is connected to an auxiliary capacitor at a second end.

In one embodiment, an impedance match is for transferring RF power to an electrode of a plasma chamber is described. The impedance match includes a housing having a bottom portion and a top portion. The bottom portion has match components and the top portion has an elongated body. A low frequency input is connected through the bottom portion of the housing, and the low frequency input is interconnected to a first set of capacitors and inductors. A high frequency input is connected through the bottom portion of the housing, and the high frequency input is interconnected to a second set of capacitors and inductors. An elongated strap extends between the bottom portion and the top portion of the housing. A lower portion of the elongated strap is coupled to the second set of capacitors and inductors and an upper portion of the elongated strap is connected to an RF rod at an end of the elongated body. An intermediate strap is coupled at a first end to the elongated strap at a mid-connection that is between the lower portion and the upper portion. The intermediate strap is connected to an auxiliary capacitor at a second end.

Some advantages of the herein described impedance matching circuit system having the elongated RF strap include saving space on a floor of a clean room of a fabrication facility. An RF strap is elongated and a housing of an impedance match circuit system that includes the RF strap is narrowed. The housing takes up less space on the floor compared to a housing of another match system.

Additional advantages of the herein described impedance matching circuit system include a housing of an impedance match. The housing of the impedance match is situated within the housing of the impedance matching circuit system and is elongated to fit components, such as a chuck power supply and a filter, and a tunable edge sheath (TES) match, within the housing of the impedance matching circuit system. Also, the elongated housing of the impedance match accommodates the elongated RF strap.

Other aspects will become apparent from the following detailed description, taken in conjunction with the accompanying drawings.

BRIEF DESCRIPTION OF THE DRAWINGS

The embodiments are understood by reference to the following description taken in conjunction with the accompanying drawings.

DETAILED DESCRIPTION

The following embodiments describe an impedance matching circuit having an elongated radio frequency (RF) strap. It will be apparent that the present embodiments may be practiced without some or all of these specific details. In other instances, well known process operations have not been described in detail in order not to unnecessarily obscure the present embodiments.

Figure 1A:
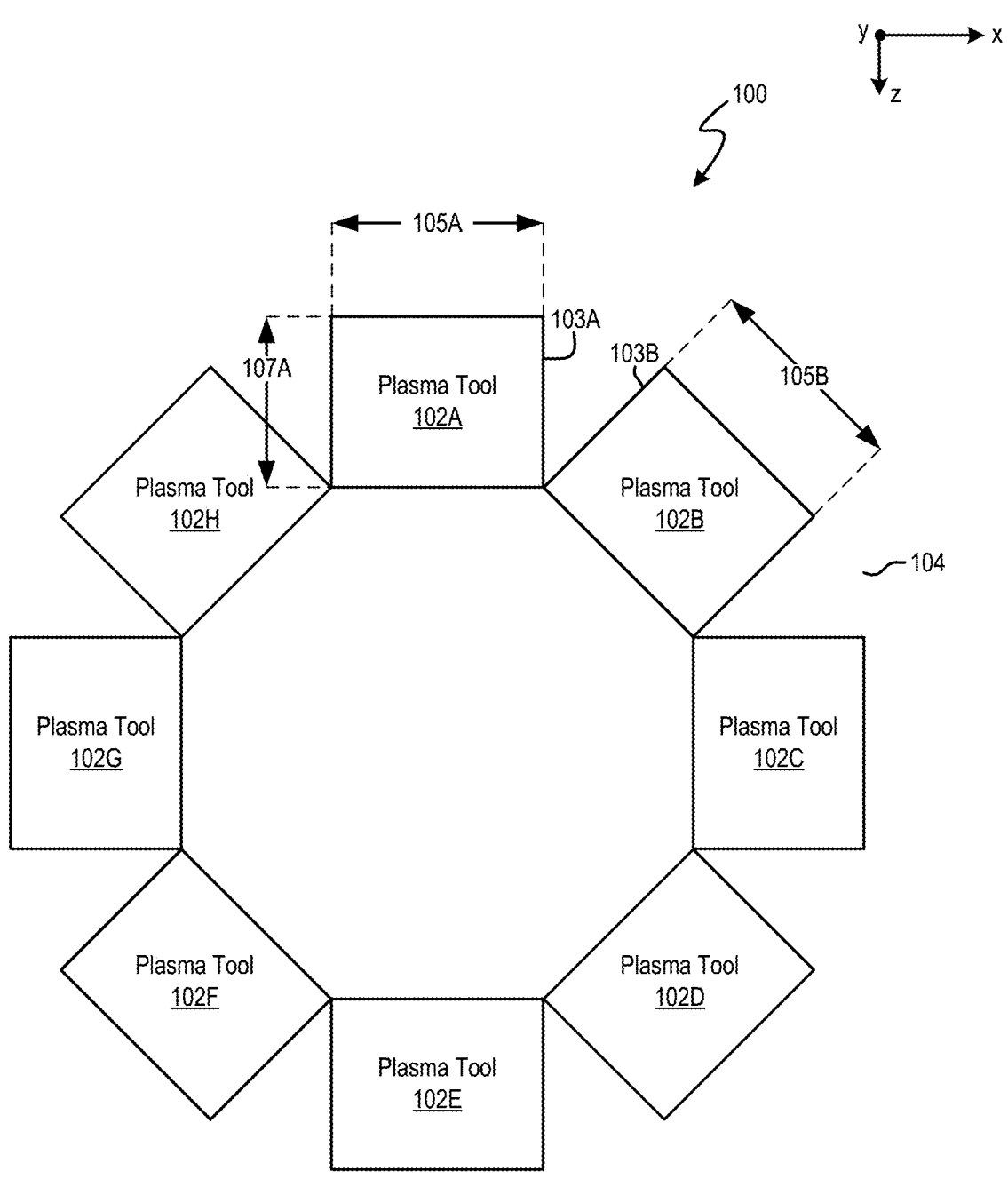
FIG. 1A is a diagram of an embodiment of a system to illustrate multiple plasma tools that consume a higher amount of floor space than that consumed by other plasma tools described herein with reference to FIG. 1B.
Figure 1B:
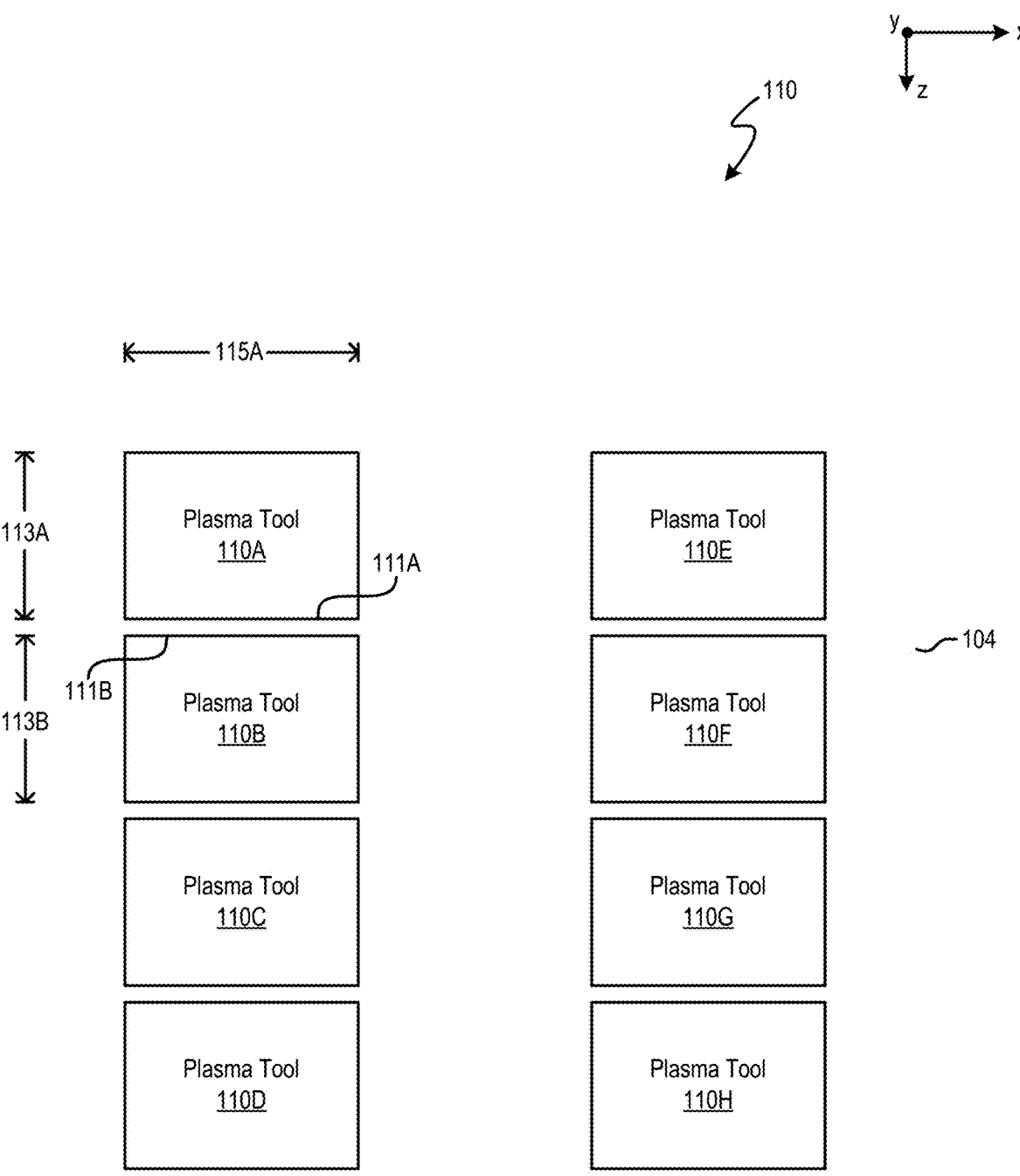
FIG. 1B is a diagram of an embodiment of a system to illustrate multiple plasma tools that consume a lower amount of floor space than that consumed by the plasma tools of FIG. 1A.

FIG. 1A is a diagram of an embodiment of a top view of a system 100 to illustrate multiple plasma tools that consume a higher amount of floor space than that consumed by other plasma tools described herein with reference to FIG. 1B. The system 100 includes multiple plasma tools 102A, 102B, 102C, 102D, 102E, 102F, 102G, and 102H.

Each plasma tool, described herein, has a length, a width, and a depth. For example, the plasma tool 102A has a width 105A and the plasma tool 102B has a width 105B. The width 105A is measured along an x-axis. The plasma tool 102A has a depth 107A, which is measured along a z-axis. The plasma tools 102A-102H are situated on a floor 104 of a fabrication facility to form an octagonal arrangement that occupies more space on the floor 104 than the plasma tools described below with reference to FIG. 1B. Each plasma tool 102A through 102H has the same dimensions, e.g., width, depth, and height, as any other of the plasma tools 102A through 102H.

It should be noted that there is space between any two adjacent plasma tools 102A-102H. For example, a side 103A of the plasma tool 102A is not adjacent to a side 103B of the plasma tool 102B and there is an empty space between the two sides 103A and 103B, and an acute angle is formed between the sides 103A and 103B. The empty space is enough for a human to enter into the space to open the plasma tool 102A or the plasma tool 102B.

In an embodiment, the terms floor space and footprint are used herein interchangeably.

FIG. 1B is a diagram of an embodiment of the system 110 to illustrate multiple plasma tools that consume a lower amount of floor space than that consumed by the plasma tools 102A-102H. The system 110 includes multiple plasma tools 110A, 110B, 110C, 110D, 110E, 110F, 110G, and 110H. Each plasma tool 110A through 110H has the same dimensions, e.g., width, depth, and height.

The plasma tool 110A has a width 113A and the plasma tool 110B has a width 113B. The width 113A is measured along the z-axis. Also, the plasma tool 110A has a depth 115A. The depth 115A is less than the depth 107A of the plasma tool 102A (FIG. 1A). The depth 115A is measured along the x-axis.

The plasma tools 110A-110H are situated on the floor 104 to form a rectangular arrangement, and the rectangular arrangement takes less space than that taken by the octagonal arrangement illustrated above with reference to FIG. 1A. For example, a human cannot enter into a space between any two adjacent ones of the plasma tools 110A-110H. As another example, a side 111A of the plasma tool 110A is adjacent to a side 111B of the plasma tool 110B such that there is a negligible amount of space or no space between the sides 111A and 111B. As yet another example, the depth 115A is less than the depth 107A and the width 113A is less than the width 105A.

In an embodiment, instead of eight plasma tools, any other number of tools, such as four or five or six, can be arranged on the floor 104.

In an embodiment, a depth of the plasma tool 110A is greater than a depth of the plasma tool 102A. In one embodiment, a width of the plasma tool 110A is greater than a width of the plasma tool 102A.

Figure 2:
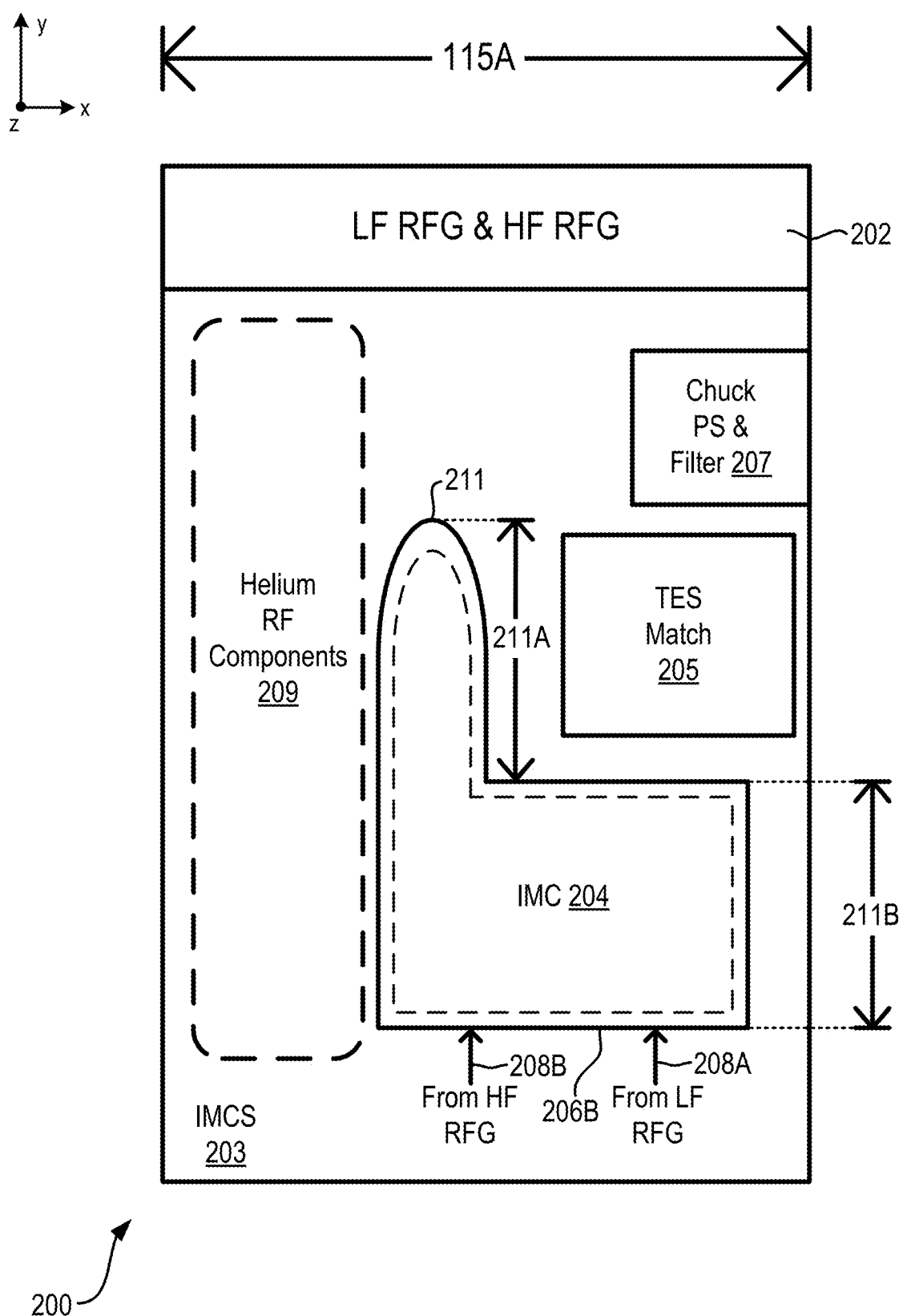
FIG. 2 is a diagram of an embodiment of a system to illustrate a stackable arrangement of components of one of the plasma tools of FIG. 1B.

FIG. 2 is a diagram of an embodiment of a system 200 to illustrate a stackable arrangement of components of a plasma tool, such as any of the plasma tools 110A-110H of FIG. 1B. The system 200 includes a system 202 and an impedance matching circuit system (IMCS) 203. The system 200 is an example of any of the plasma tools 110A through 110H (FIG. 1B).

The IMCS 203 is a housing that includes a housing 211. Examples of a housing, as used herein, include a compartment, an enclosure, a box, a container, etc. The housing 211 encloses an impedance matching circuit (IMC) 204. The IMCS 203 further includes a tunable edge sheath (TES) match enclosure 205, a chuck power supply (PS) and filter enclosure 207, and a set 209 of helium radio frequency (RF) components. The set 209 is sometimes referred to herein as a set of facilities and RF components. Examples of an enclosure, as used herein, include a compartment, a housing, a box, a container, etc. The chuck PS and filter enclosure 207 includes a chuck power supply that provides direct current (DC) power to an electrode, such as a chuck. The chuck PS and filter enclosure 207 further includes a filter that filters out RF power from being coupled to the DC power to reduce chances of interference of the RF power with the DC power. The TES match enclosure 205 includes a TES match that is coupled to a tunable edge ring (TER) that surrounds the electrode. The TES match includes electrical components, such as one or more inductors, one or more resistors, or one or more capacitors, or a combination thereof, and electrical components are coupled to each other. The electrical components of the TES match have impedances that provide a match between an impedance of a load, such as the TER, that is coupled to an output of the TES match and a source that is coupled to an input of the TES match. An example of the source coupled to the input of the TES match includes an RF generator and an RF cable that couples the RF generator to the input of the TES match.

The housing 211 has a top portion 211A and a bottom portion 211B. A shape of the top portion 211A is elongated. For example, the shape of the top portion 211A is substantially narrower than a shape of the bottom portion 211B to facilitate the TES match enclosure 205 to be fitted within the IMCS 203. Moreover, the elongated shape of the top portion 211A allows the chuck PS and filter enclosure 207 and the TES match enclosure 205 to be fitted within the IMCS 203. The TES match enclosure 205 is located above the bottom portion 211B and the chuck PS and filter enclosure 207 is located above the TES match enclosure 205. The set 209 of helium components are located beside the housing 211 of the IMC 204 on a side that is opposite to a side on which the TES match enclosure 205 is located.

The set 209 of helium RF components include multiple conduits, such as helium channels, for passage of a coolant gas for controlling a temperature of the electrode, such as a lower electrode, of a plasma chamber. The multiple conduits extend to the electrode to cool different zones within a gap between an upper electrode and the lower electrode of the plasma chamber. The temperature is controlled by increasing or decreasing a flow of the coolant gas to the electrode. For example, the temperature is increased when the flow of the coolant gas to the electrode is increased and the temperature is decreased when the flow of the cooling gas to the electrode is decreased. An example of the coolant gas includes helium and examples of the electrode include a chuck and a substrate support.

Moreover, the set 209 of helium RF components includes an alternating current (AC) power supply for providing power to an electric motor, which can be connected to the electrode for rotating the electrode to process a substrate placed on top of the electrode. Also, the set 209 of helium RF components include a gap driver, which includes a motor and a set of transistors, to control, such as increase or decrease, an amount of the gap between the lower electrode and the upper electrode of the plasma chamber. The set 209 of helium RF components further includes sensors, such as complex current and voltage sensors, voltage sensors, power sensors, etc., to sense a variable at an output of the IMC 204 or at an input of the IMC 204. Examples of the variable include complex voltage and current, impedance, voltage, power, reflected power, and supplied power.

In one embodiment, a dielectric ring is located between the electrode, such as the chuck, and the tunable edge ring.

The system 202 includes a low frequency (LF) RF generator and a high frequency RF generator, and is located above the IMCS 203. An example of the low frequency RF generator is an RF generator having a low frequency of operation of 400 kilohertz (kHz) RF generator and an example of the high frequency RF generator is an RF generator having a high frequency of operation of 27 megahertz (MHz) or 60 MHz RF generator. Another example of the low frequency RF generator is an RF generator having the low frequency of operation of 2 MHz. The system 202 is situated on top of the IMCS 203 to save space on the floor 104 (FIGS. 1A and 1B).

The housing 211 of the IMC 204 has a bottom wall 206B. The low frequency RF generator of the system 202 is connected via an opening in the bottom wall 206B to circuit components of the impedance matching circuit 204. For example, the low frequency RF generator is coupled via an RF cable 208A that goes through the opening in the bottom wall 206B to couple to the circuit components of the impedance matching circuit 204. Similarly, the high frequency RF generator of the system 202 is connected via an opening in the bottom wall 206B to the circuit components of the impedance matching circuit 204. For example, the low frequency RF generator is coupled via an RF cable 208B that goes through the opening in the bottom wall 206B to couple to the circuit components of the impedance matching circuit 204.

In one embodiment, the terms impedance matching circuit, impedance matching network, match, impedance match, matching network, match circuit, and match network are used herein interchangeably.

In one embodiment, the system 202 is not on top of the IMCS 203 but is situated over the IMCS 203. For example, a carrier, such as a network of support rods, is provided over the IMCS 203, and the system 202 is supported by the carrier.

In an embodiment, the system 202 is located within the IMCS 203.

In an embodiment, the RF transmission line 502 includes the substrate support 506 and the substrate support 506 is surrounded by the RF sheath of the RF transmission line 502.

In one embodiment, the terms substrate support and powered electrode as used herein interchangeably.

Figure 3:
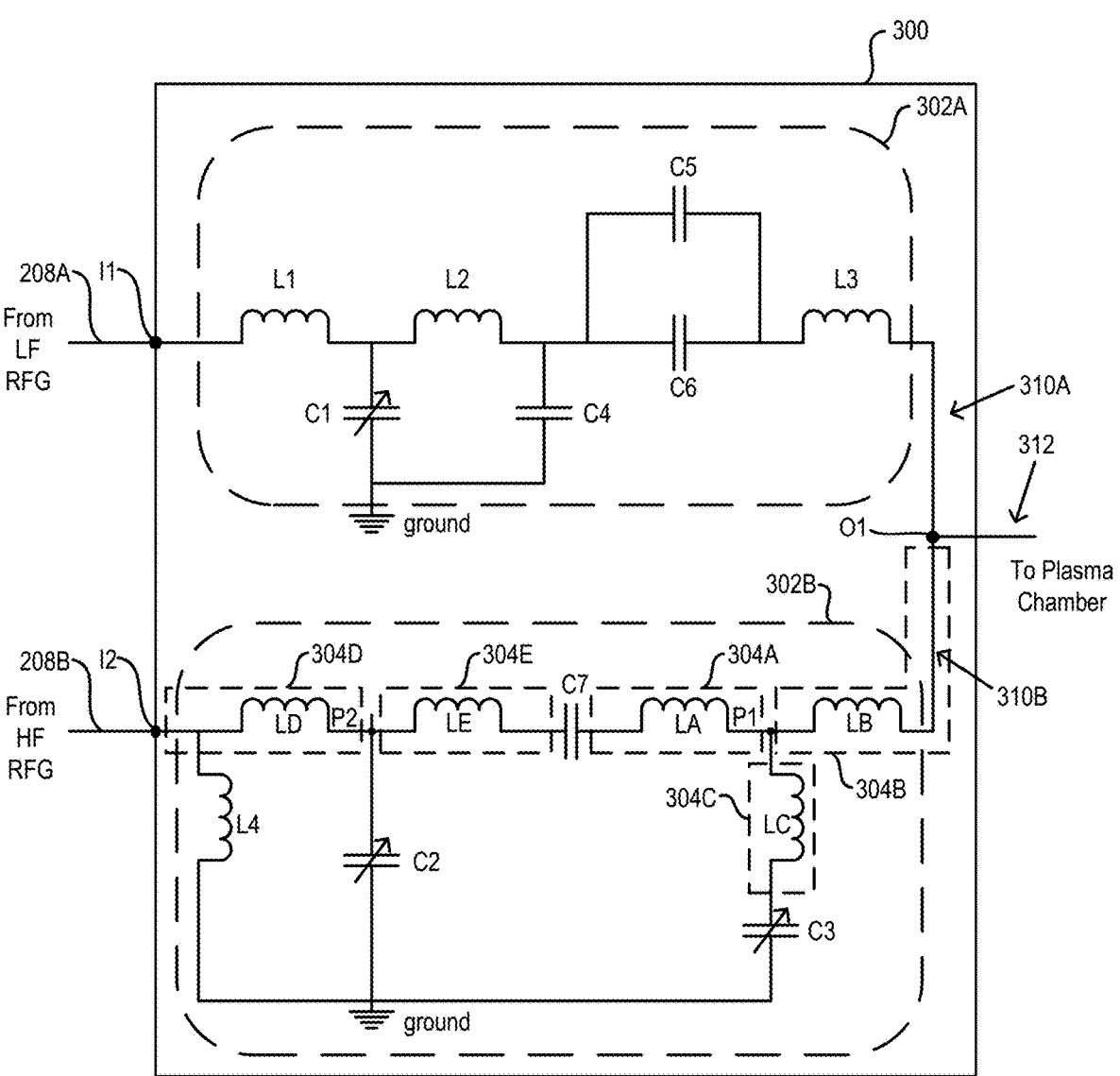
FIG. 3 is a diagram of an embodiment of an impedance matching circuit to illustrate inductances associated with radio frequency (RF) straps of the impedance matching circuit.

FIG. 3 is a diagram of an embodiment of an impedance matching circuit 300 to illustrate inductances associated with RF straps of the impedance matching circuit 300. The impedance matching circuit 300 is an example of the impedance matching circuit 204 (FIG. 2).

The impedance matching circuit 300 includes a branch 302A and a second branch 302B. The branch 302A includes circuit components, such as an inductor L1, an inductor L2, a capacitor C1, a capacitor C4, a capacitor C5, a capacitor C6, and an inductor L3. The capacitors C5 and C6 are direct current (DC) blocking capacitors, which are further described below. The branch 302B includes circuit components, such as an inductor L4, a capacitor C2, a capacitor C7, and a capacitor C3. The capacitors C1, C2, and C3 are variable capacitors. C1 and C2 are main capacitors and C3 is an auxiliary capacitor. The inductors L1 through L4 are coils that are wound to form an inductor and are not RF straps.

The branch 302B further includes an RF strap portion 304A, an RF strap portion 304B, an RF strap 304C, an RF strap 304D, and an RF strap 304E. The portions 304A and 304B are portions of one RF strap. As an example, an RF strap, as used herein, is a flat elongated piece of metal that is made from a conductor, such as copper or an alloy of copper. To illustrate, the RF strap has a length, a width and a thickness. The length of the RF strap is greater than the width of the RF strap and the width is greater than the thickness of the RF strap. As another illustration, the RF strap occupies a substantially rectangular volume or a rectangular volume and is flexible to be bent or re-shaped. An example of the rectangular volume is a volume occupied by a rectangular bar.

The inductor L1 is coupled via a connection to an input I1 of the impedance matching circuit 300 and is coupled via a connection to the inductor L2. An example of the input I1 is an end of the connection between the input I1 and the inductor L1. An example of a connection, as used herein, includes a conductive wire or a cable or an RF strap or a series of RF straps or a connector a combination thereof. Also, the capacitor C1 is coupled to a point on the connection between the inductors L1 and L2 and is coupled to a ground potential. Examples of a point, as used herein, include a connector, such as a metal bolt and nut, or a conductive bolt and nut, or a welding point, that couples one connection to another connection.

The inductor L2 is coupled via a connection to the capacitor C6 and the capacitor C4 is coupled to a point on the connection between the inductor L2 and the capacitor C6. The capacitor C4 is also coupled to the ground potential. The capacitor C5 is coupled in parallel to the capacitor C5. The capacitor C6 is coupled via a connection to the inductor L3, which is coupled via a connection to an output O1 of the impedance matching circuit 300.

The inductor L4 is coupled via a connection to an input I2 of the impedance matching circuit 300 and is coupled to the ground connection. An example of the input I2 is an end of the connection between the input I2 and the inductor L4. The inductor L4 is coupled to a point on the RF strap 304D. An example of the input I2 is an end of the RF strap 304D. The capacitor C2 is coupled to a point P2 between the RF straps 304D and 304E. The RF straps 304D and 304E are connected to each other at the point P2. The capacitor C2 is also coupled to the ground connection. The capacitor C7 is coupled to the RF strap 304E and to the RF strap portion 304A.

The capacitor C3 is coupled to the RF strap 304C, which is coupled to a point P1 of the branch 302B. The capacitor C3 is also coupled to the ground connection. The RF strap portion 304A is coupled to the RF strap portion 304B at the point P1. The RF strap portion 304B is coupled to the output O1 of the impedance matching circuit 300.

Each RF strap portion 304A and 304B and each RF strap 304C-304E has a respective inductance. For example, the RF strap portion 304A has an inductance LA, the RF strap portion 304B as another inductance LB, the RF strap 304C has yet another inductance LC, the RF strap 304D has an inductance LD, and the RF strap 304E has an inductance LE. It should be noted that any RF strap, described herein, such as any of the RF straps 304A-304E, are not wound into a coil to form an inductor but is a flat elongated piece of metal.

As an example, the inductor L1 has an inductance that ranges from 45 microHenries (μH) to 55 microHenries. To illustrate, the inductor L1 has an inductance of 40 micro-Henries. As another example, the inductor L2 has an inductance that ranges from 35 microHenries to 41 microHenries. To illustrate, the inductor L2 has an inductance of 38 microHenries. As yet another example, the capacitor C1 has a capacitance that ranges from 60 picoFarads (pF) to 2000 picoFarads. As another example, the capacitor C4 has a capacitance that ranges from 110 picoFarads to 120 pico-Farads. Also, as an example, the capacitor C5 has a capacitance that ranges from 2700 picoFarads to 2900 picoFarads. To illustrate, the capacitor C5 has a capacitance of 2800 picoFarads. As another example, the inductor L3 has an inductance that ranges from 2.1 microHenries to 2.3 micro-Henries. To illustrate, the inductor L3 has an inductance of 2.2 microHenries.

As yet another example, the inductor L4 has an inductance that ranges from 0.44 microHenry to 0.46 microHenry. To illustrate, the inductor L4 has an inductance of 0.45 microHenry. Also, as an example, the capacitor C2 has a capacitance that ranges from 25 picoFarads to 250 picoFarads. As another example, the capacitor C7 has a capacitance that ranges from 7 picoFarads to 17 picoFarads. As yet another example, the capacitor C3 has a capacitance that ranges from 3 picoFarads to 30 picoFarads.

An RF signal generated by the low frequency RF generator is received at the input I1 and is sent via the inductor L1, the inductor L2, the capacitors C5 and C6, and the inductor L3 to the output O1. The capacitors C1 and C4 change an impedance of the RF signal received at the input I1.

Moreover, an RF signal generated by the high frequency RF generator is received at the input I2 and is sent via the RF strap 304D, the point p2, the RF strap 304E, the capacitor C7, the RF strap portion 304A, and the RF strap portion 304B to the output O1. The inductor L4, the capacitor C2, the RF strap 304C, and the capacitor C3 modify an impedance of the RF signal received at the input I2.

The branch circuit 302A modifies an impedance of the low frequency RF signal received at the input I1 to reduce power reflected from the plasma chamber towards the low frequency RF generator via the impedance matching circuit 300. The impedance is modified to match an impedance of a load coupled to the output O1 with an impedance of a source coupled to the input I1 to output a modified RF signal 310A from an output of the inductor L3. An example of the load includes the plasma chamber and an RF transmission line that couples the impedance matching circuit 300 to the plasma chamber. An example of the source coupled to the input I1 includes the low frequency RF generator and the RF cable 208A (FIG. 2) that couples the low frequency RF generator to the input I1.

Similarly, the branch circuit 302B modifies an impedance of the high frequency RF signal received at the input I2 to reduce power reflected from the plasma chamber towards the high frequency RF generator via the impedance matching circuit 300. The impedance is modified to match an impedance of the load coupled to the output O1 with an impedance of a source coupled to the input I2 to output a modified RF signal 310B from an output of the RF strap portion 304B. An example of the source coupled to the input I2 includes the high frequency RF generator and the RF cable 208B (FIG. 2) that couples the high frequency RF generator to the input I2. The modified signals 310A and 310B output from the inductor L3 and the RF strap portion 304B are combined, such as added, at the output O1, to output a combined RF signal 312 from the output O1.

In one embodiment, any of the capacitors or inductors illustrated in FIG. 3 is fixed or variable. For example, one or more of the capacitors C4 through C7 are fixed capacitors. As another example, one or more of the inductors L1 through L4 are variable inductors and their inductances can be varied.

In an embodiment, instead of the RF strap portions 304A and 304B, two RF straps are used. For example, a first RF strap having an inductance of the RF strap portion 304A is connected via a connector to a second RF strap having an inductance of the RF strap portion 304B. Examples of the connector are provided below.

In an embodiment, the impedance matching circuit 300 includes a different number of capacitors than that illustrated in FIG. 3. For example, instead of the capacitors C5 and C6, one capacitor is used. In one embodiment, the impedance matching circuit 300 includes a different number of inductors than that illustrated in FIG. 3.

Figure 4A:
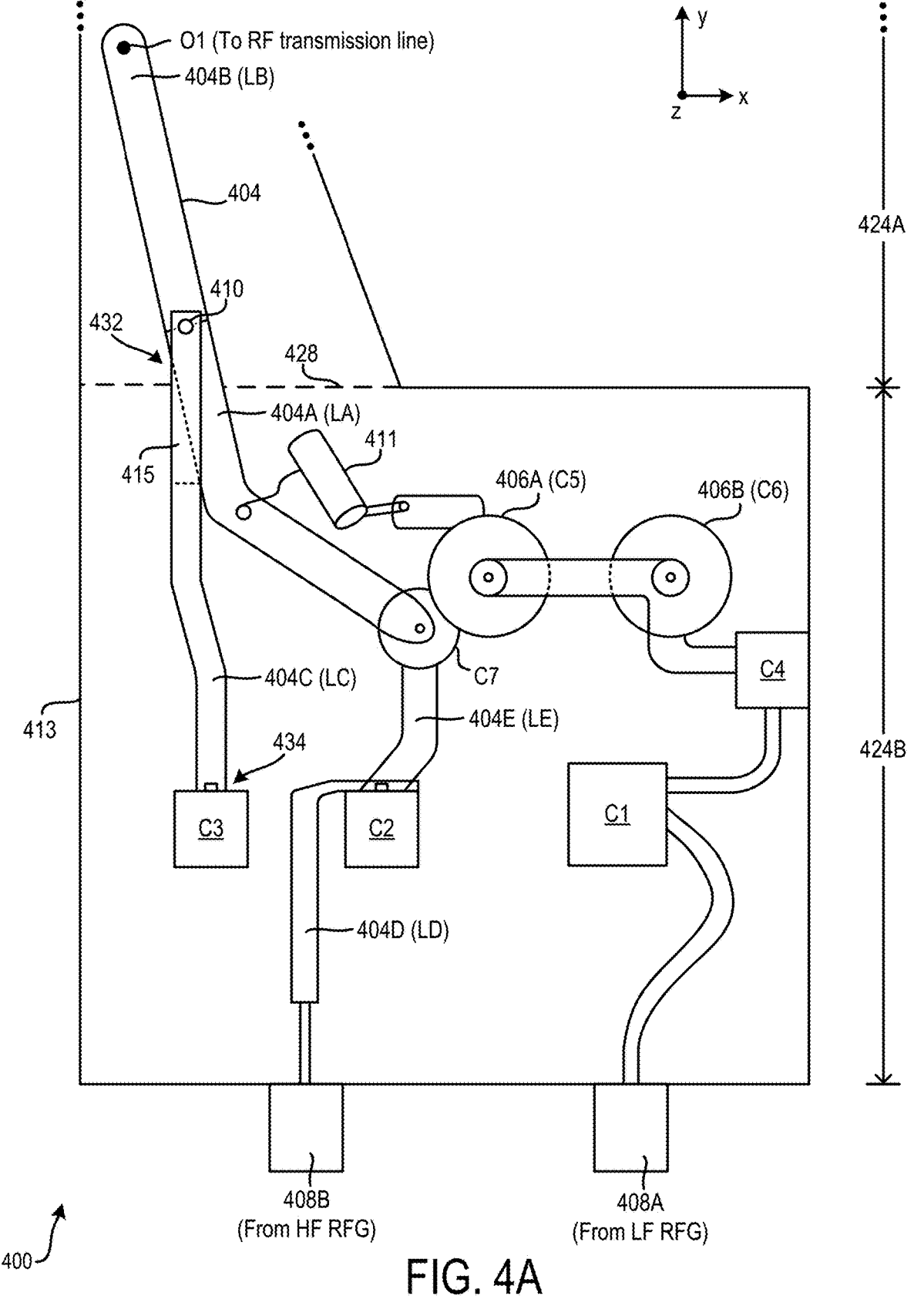
FIG. 4A is an internal view within a housing of an impedance matching circuit to illustrate an arrangement of RF straps of the impedance matching circuit.

FIG. 4A is an internal view of a housing 413 of an impedance matching circuit 400 to illustrate an arrangement of RF straps of the impedance matching circuit 400. The impedance matching circuit 400 is an example of the impedance matching circuit 300 (FIG. 3) and the housing 413 is an example of the housing 211 (FIG. 2) of the impedance matching circuit 204 (FIG. 2).

The impedance matching circuit 400 includes an RF strap portion 404A, an RF strap portion 404B, and an RF strap 404C, which is sometimes referred to herein as an interme-diate strap. The RF strap portion 404A is an example of the RF strap portion 304A (FIG. 3), the RF strap portion 404B is an example of the RF strap portion 304B (FIG. 3), and the RF strap 404C is an example of the RF strap 304C (FIG. 3). The RF strap portion 404A is sometimes referred to herein as a lower portion and the RF strap portion 404B is some-times referred to herein as an upper portion. The RF strap portions 404A and 404B are portions of an RF strap 404, which is sometimes referred to herein as an elongated strap. For example, the RF strap portions 404A and 404B are fabricated from one elongated piece of metal. The RF strap 404C is shorter in length than the RF strap 404.

The RF strap 404 extends between a top part 424A of the housing 413 and a bottom part 424B of the housing 413. For example, the RF strap 404 extends from the bottom part 424B via an imaginary base 428 to the top part 424A. The top part 424A is an example of the top portion 211A (FIG. 2) and the bottom part 424B is an example of the bottom portion 211B (FIG. 2). The imaginary base 428 is further described below with reference to FIG. 4B.

The impedance matching circuit 400 further includes a port 408A for receiving the RF cable 208A (FIG. 2) that is coupled to an output of the low frequency RF generator and includes a port 408B for receiving the RF cable 208B (FIG. 2) that is coupled to an output of the high frequency RF generator. The port 408A includes a communication end-point, such as a connector, for the RF cable 208A to communicate the low frequency RF signal generated by the low frequency RF generator to the impedance matching circuit 400 and the port 408B includes a communication endpoint, such as a connector, for the RF cable 208B to communicate the high frequency RF signal generated by the high frequency RF generator to the impedance matching circuit 400. The impedance matching circuit 400 includes the capacitors C1 through C3, and further includes DC blocking capacitors 406A and 406B, which block DC power from negatively affecting the circuit components of the impedance matching circuit 400. The DC blocking capacitors 406A and 406B are examples of the DC blocking capacitors C5 and C6 (FIG. 3). The impedance matching circuit 400 includes a filter 411 for filtering out the high frequency of the RF signal received at the input I2 to protect circuit components, such as the capacitor C1, that operate at the low frequency.

A first end 432 of the RF strap 404C is coupled via a connector 410, such as a screw or a bolt, to the RF strap portions 404A and 404B. The connector 410 is sometimes referred to herein as a mid-connection and is between the RF strap portion 404A and the RF strap portion 404B. A second end 434 of the RF strap 404C is connected to the capacitor C3. The first end 432 is located opposite to the second end 434 and a body of the RF strap 404C is located between the two ends 432 and 434. A portion 415 of the RF strap 404C overlaps a portion of the RF strap portion 404B in a direction along the z-axis but is not in physical contact with the portion of the RF strap portion 404B. As an example, the RF strap portion 404A and the RF strap 404C are connected to each other via the connector 410 and the RF strap portion 404A is not connected to the RF strap 404C at any other point along the RF strap portion 404A.

The connector 410 is an example of the point P1 in FIG. 3. The output O1 of the impedance matching circuit 400 is coupled via the RF transmission line to the electrode of the plasma chamber. Moreover, the RF strap portion 404B is also elongated to be coupled to the output O1 and is elongated to be coupled via the connector 410 to the RF strap 404C. Also, the RF strap portion 404A is elongated to be coupled via the connector 410 to the RF strap 404C.

In one embodiment, an elongated RF strap has a length that is substantially greater than a width of the RF strap. For example, a length of the RF strap 404C is between 10 to 20 times a width of the RF strap 404C. As another example, a total length of the RF strap portions 404A and 404B is between 10 to 30 times a width of the RF strap portions 404A and 404B. The elongated RF strap portions 404A and 404B and the RF strap 404C facilitate a narrower construction of the housing 413 of the impedance matching circuit 400 to save floor space. Also, the narrower construction of the housing 413 facilitates components, such as the set 209 (FIG. 2) of helium RF components, and compartments, such as the chuck PS and filter compartment 207 (FIG. 2) and the TES match compartment 205 (FIG. 2), to be fitted within the IMCS 203 (FIG. 2).

Figure 4B:
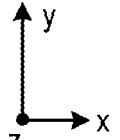
FIG. 4B is a diagram of an embodiment of a front view of a housing of an impedance matching circuit.
Figure 4B:
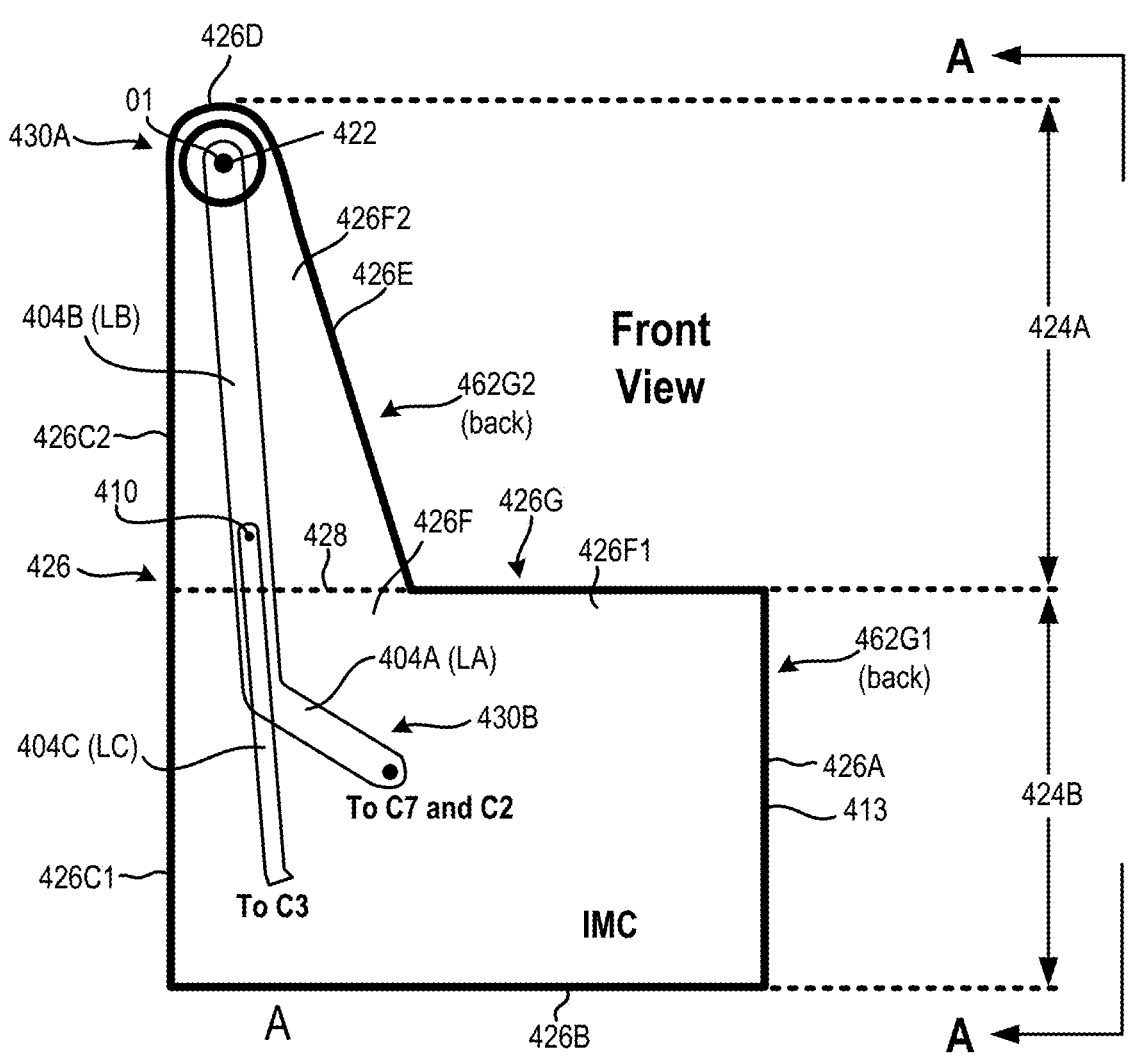

FIG. 4B is a diagram of an embodiment of the housing 413 of the impedance matching circuit 400 (FIG. 4A). The housing 413 includes the RF strap portions 404A and 404B that are connected to the RF strap 404C via the connector 410. Also, an end 430A of the RF strap portion 404B is connected via the output O1 to an RF rod 422 of the RF transmission line and an opposite end 430B of the RF strap portion 404B is connected to the capacitors C2 and C7 in a manner illustrated with reference to FIG. 3. The RF rod connects to the plasma chamber, that faces a back surface 426G of the housing 413. The RF transmission line includes the RF rod 422 and an RF sheath that surrounds the RF rod 422. The RF sheath is separated from the RF rod 422 by an insulation material that surrounds the RF rod 422. The insulation material is located between the RF rod 422 and the RF sheath.

The housing 413 has the top part 424A and the bottom part 424B. The top part 424A is sometimes referred to herein as a top portion and the bottom part 424B is sometimes referred to herein as a bottom portion. The top part 424A is narrower, along the x-axis, than the bottom part 424B. As an example, the top part 424A has a narrower width than the bottom part 424B. Also, the top part 424A has a length, along a y-axis. As an example, the length of the top part 424A ranges between 6 and 12 inches. To illustrate, the length of the top part 424A ranges between 8 and 10 inches. The top part 424A provides a housing for or houses the RF strap portion 404B and the bottom part 424B provides a housing for or houses the RF strap portion 404A. For example, the top part 424A provides a cover for the RF strap portion 404B and the bottom part 424B provides a cover for the RF strap portion 404A. The x-axis is perpendicular to the y-axis and both the x and y axes are perpendicular to the z-axis.

The bottom part 424B has a side surface 426A, a bottom surface 426B, a side surface portion 426C1, a front surface portion 426F1, and a back surface portion 426G1. The top part 424A has a side surface 426E, a top surface 426D, a side surface portion 426C2, a front surface portion 426F2, and a back surface portion 426G2.

The side surface portions 426C1 and 426C2 are contiguous with each other and are portions of a side surface 426C of the housing 413. Similarly, the front surface portions 426F1 and 426F2 are contiguous with each other and are portions of a front surface 426F of the housing 413 and the back surface portions 426G1 and 426G2 are contiguous with each other and are portions of the back surface 426G of the housing 413.

The imaginary base 428 of the top part 424A separates the top part 424A from the bottom part 424B. For example, the imaginary base 428 separates the side surface portion 426C1 from the side surface portion 426C2. The connector 410 is proximate to the imaginary base 428. For example, the connector 410 is located closer to the imaginary base 428 than to the top surface 426D.

The top surface 426D is curved. Also, the top part 424A that is narrower than the bottom part 424B has a volume that is less than a volume of the bottom part 424B. Moreover, the top part 424A is narrower in width than a top part of a match of any of the plasma tools 102A-102H (FIG. 1A) to accommodate the RF strap portion 404B to be within the top part 404B. Also, the top part 424A is longer than the top part of the match of any of the plasma tools 102A-102H. The narrower width of the top part 424A facilitates the components, such as the set 209 (FIG. 2) of helium RF components, and compartments, such as the chuck PS and filter compartment 207 (FIG. 2) and the TES match compartment 205 (FIG. 2), to be fitted within the IMCS 203 (FIG. 2).

In an embodiment, instead of the connector 410 being located within the top part 424A, the connector 410 is located within the bottom part 424B and is proximate to the imaginary base 428. For example, the connector 410 is located closer to the imaginary base 428 than to the bottom surface 426B.

In one embodiment, a portion of the RF strap portion 404B extends from the top part 424A to the bottom part 424B. In an embodiment, a portion of the RF strap portion 404A extends from the bottom part 424B to the top part 424A.

In an embodiment, a portion of the RF strap 404C extends from the bottom part 424B to the top part 424A.

Figure 4C:
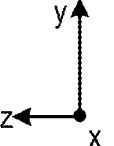
FIG. 4C is a diagram of an embodiment of a side view of the housing of the impedance matching circuit.
Figure 4C:
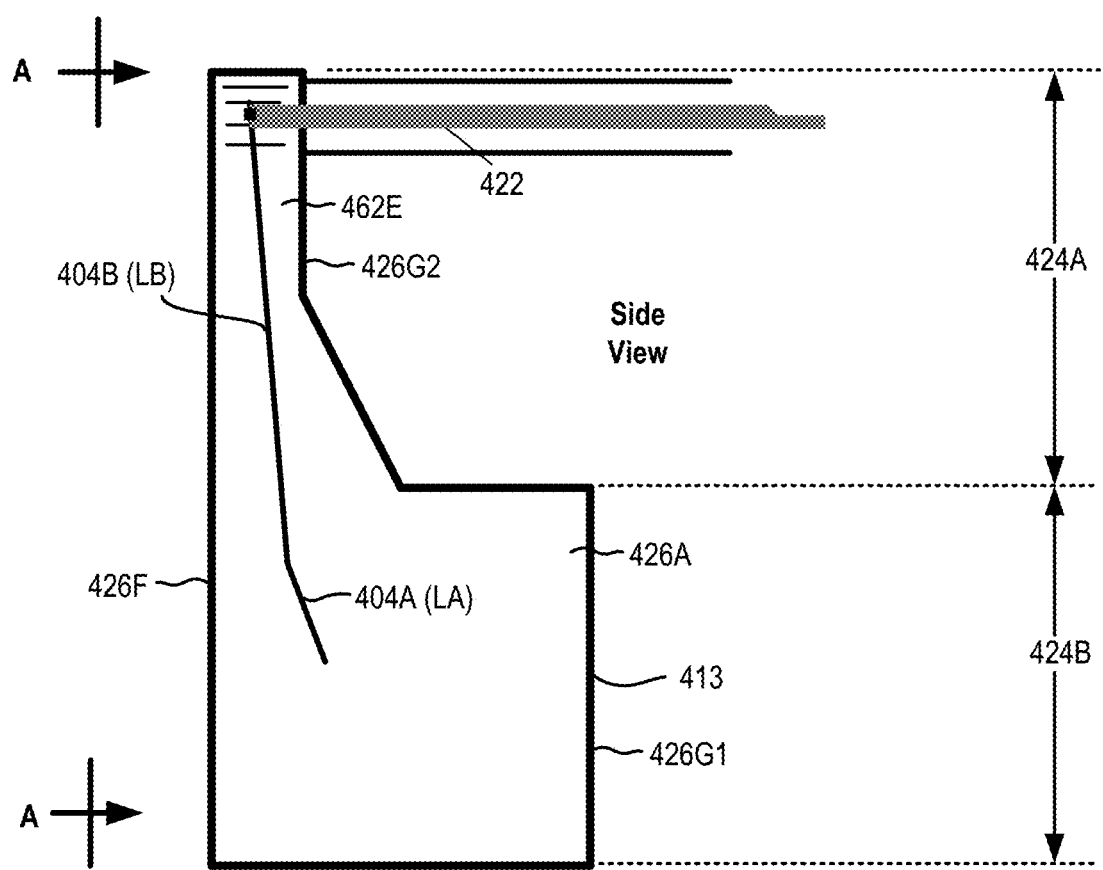

FIG. 4C illustrates a side view of FIG. 4B, from cross-section A-A. This view shows that the top part 424A is elongated for extending the elongated RF strap portion 404A up to the output O1, which connects to the RF rod 422. For example, the top part 424A is elongated such that a width, along the x-axis, of the top part 424A is smaller or substantially smaller than a length, along the y-axis, of the top part 424A. To illustrate, a width of the imaginary base 428 is half or approximately half the length of the top part 424A. This side view of FIG. 4C also shows that the RF rod 422 is perpendicular or substantially perpendicular to the front view of FIG. 4C. As an advantage, for servicing, the front view of FIG. 4B enables full access to all the circuit components of the impedance matching circuit 300 (FIG. 3), without having to pull out the housing 413. For example, the housing 413 of the impedance matching circuit 300 allows access from a front side, such as the side 426F, of the housing 413. To illustrate, the front side 426 is a side opposite to a process module, e.g., the plasma chamber.

Also, the bottom part 424B is narrower than a maximum width of the match of any of the plasma tools 102A-102H (FIG. 1A). The maximum width of the match of any of the plasma tools 102A-102H is a width of a bottom part of the match. Also, as illustrated in FIG. 4C, the top part 424A is narrower than the bottom part 424B in a direction along the z-axis. Moreover, as illustrated in FIG. 4B, the top part 424A is narrower than the bottom part 424B in a direction along the x-axis. The narrowness of the top part 424A and of the bottom part 424B saves floor space on the floor 104 (FIG. 1B).

Figure 5:
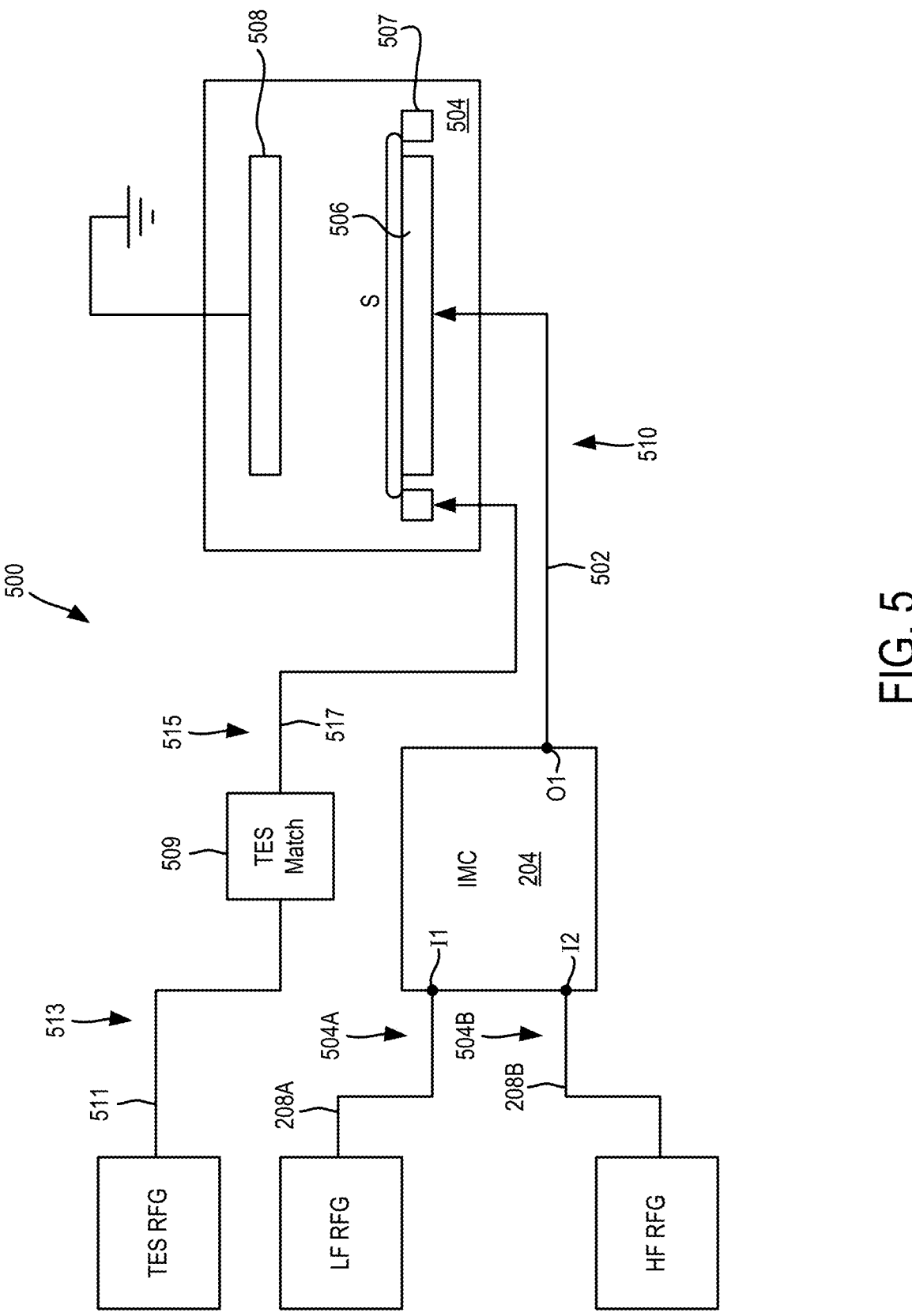
FIG. 5 is a diagram of an embodiment of a system to illustrate use of the impedance matching circuit.

FIG. 5 is a diagram of an embodiment of a system 500 to illustrate use of the impedance matching circuit 204. The system 500 includes the low frequency RF generator (LF RFG), the high frequency RF generator (HF RFG), the RF cables 208A and 208B, the impedance matching circuit 204, an RF transmission line 502, and a plasma chamber 504. The system 500 further includes another RF generator, such as a TES RF generator. Also, the system 500 includes an RF cable 511, a TES match 509, and an RF transmission line 517.

The TES RF generator is a low frequency or a high frequency RF generator. For example, the TES RF generator has the low frequency or the high frequency, and examples of the low frequency and the high frequency are provided above. The TES match 509 is located within the TES match enclosure 205 (FIG. 2).

The RF transmission line 502 includes the RF rod 422 (FIG. 4B) and the RF sheath. The RF rod 422 is surrounded by the insulation material of the RF transmission line 502, and the insulation material is surrounded by the RF sheath of the RF transmission line 502. Similarly, the RF transmission line 517 includes an RF rod and an RF sheath that surrounds the RF rod. Also, an insulation material surrounds the RF rod of the RF transmission line 517, and the RF sheath of the RF transmission line 517 surrounds the insulation material.

The plasma chamber 504 includes a substrate support 506 and an upper electrode 508. An example of the substrate support 506 is the chuck, which includes the lower electrode. The lower electrode is made from a metal, such as aluminum or an alloy of aluminum. The substrate support 506 is made from the metal and from ceramic, such as aluminum oxide (Al₂O₃). The upper electrode 508 is fabricated from silicon and is coupled to a ground connection. The plasma chamber 504 further includes a TER 507 that surrounds the substrate support 506. The TER 507 is made from one or more materials, e.g., crystal silicon, polycrystalline silicon, silicon carbide, quartz, aluminum oxide, aluminum nitride, silicon nitride, etc. The TER 507 performs many functions, including positioning a substrate S on the substrate support 506 and shielding underlying components, such as a coupling ring, of the plasma chamber 504, not protected by a substrate S from being damaged by the ions of plasma formed within the plasma chamber 504. The TER 507 also confines the plasma to an area above the substrate S and protects the substrate support 506 from erosion by the plasma.

The TES RF generator is coupled via the RF cable 511 to an input of the TES match 509. An output of the TES match 519 is coupled via the RF transmission line 517 to the TER 507.

The low frequency RF generator generates a low frequency RF signal 504A and sends the low frequency RF signal 504A via the RF cable 208A to the input I1 of the impedance matching circuit 204. Similarly, the high frequency RF generator generates a high frequency RF signal 504B and sends the high frequency RF signal 504B by the RF cable 208B to the input I2 of the impedance matching circuit 204.

A branch, such as the branch 302A (FIG. 3), of the impedance matching circuit 204 receives the low frequency RF signal 504A from the input I1, and modifies an impedance of the low frequency RF signal 504A to match an impedance of the load coupled to the output O1 with an impedance of the source coupled to the input I1 to output a first modified RF signal, such as the modified RF signal 310A (FIG. 3). An example of the load coupled to the output O1 includes the plasma chamber 504 and the RF transmission line 502. An example of the source coupled to the input I1 includes the low frequency RF generator and the RF cable 208A.

Similarly, a branch, such as the branch 302B (FIG. 3), of the impedance matching circuit 204 receives the high frequency RF signal 504B from the input I2, and modifies an impedance of the high frequency RF signal 504B to match an impedance of the load coupled to the output O1 with an impedance of the source coupled to the input I2 to output a second modified RF signal, such as the modified RF signal 310B (FIG. 3). The first and second modified RF signals 310A and 310B are combined, such as added, at the output O1, to output a combined RF signal 510 at the output O1. An example of the source coupled to the input I2 includes the high frequency RF generator and the RF cable 208B. The combined RF signal 312 (FIG. 3) is an example of the combined RF signal 510.

The combined RF signal 510 is supplied via the RF transmission line 502 to the lower electrode of the plasma chamber 504 to strike or maintain the plasma within the plasma chamber. For example, when one or more process gases, such as an oxygen containing gas or a fluorine containing gas, are supplied to a gap between the upper electrode 508 and the substrate support 506 with the supply of the combined RF signal 510, the plasma is stricken or maintained within the plasma chamber 504.

In addition, the TES RFG generates an RF signal 513 and sends the RF signal 513 via the RF cable 511 to the input of the TES match 509. Upon receiving the RF signal 513, the TES match 509 matches an impedance of a load coupled to the output of the TES match 509 and a source coupled to the input of the TES match 509 to output a modified RF signal 515 at the output of the TES match 519. An example of the source coupled to the input of the TES match 519 includes the TES RFG and the RF cable 511 and an example of the source coupled to the output of the TES match 509 includes the TER 507 and the RF transmission line 517. The TER 507 receives the modified RF signal 515 to process an edge region of the substrate S.

In one embodiment, the coupling ring is located below the TER 507 and surrounds the substrate support 506. The coupling ring is made from an electrical insulator material, e.g., a dielectric material, ceramic, glass, composite polymer, aluminum oxide, etc.

Embodiments, described herein, may be practiced with various computer system configurations including hand-held hardware units, microprocessor systems, microprocessor-based or programmable consumer electronics, minicomputers, mainframe computers and the like. The embodiments, described herein, can also be practiced in distributed computing environments where tasks are performed by remote processing hardware units that are linked through a computer network.

In some embodiments, a controller is part of a system, which may be part of the above-described examples. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which may control various components or subparts of the system. The controller, depending on processing requirements and/or a type of the system, is programmed to control any process disclosed herein, including a delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as application specific integrated circuits (ASICs), programmable logic devices (PLDs), one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In some examples, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, a plasma system, described herein, includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, or any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an X MHz RF generator, a Y MHz RF generator, and a Z MHz RF generator are coupled to an inductor within the ICP plasma chamber, where X, Y, and Z are integers. As another example, the 400 kHz RF generator, the Y MHz RF generator, and the Z MHz RF generator are coupled to the inductor within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. An impedance matching circuit system comprising:
a housing having an impedance matching circuit, wherein the housing has a top portion and a bottom portion, wherein the top portion is narrower than the bottom portion;
a tunable edge sheath (TES) match compartment located above the bottom portion and besides the top portion; and
a set of helium components located besides the housing of the impedance matching circuit.

2. The impedance match circuit system of claim 1, wherein the top portion has a first width that is less than a first width of the bottom portion and has a volume that is less than a volume of the bottom portion, wherein the first widths of the top and bottom portions are measured along a first axis.

3. The impedance match circuit system of claim 2, wherein the top portion has a second width that is less than a second width of the bottom portion, wherein the second widths of the top and bottom portions are measured along a second axis, wherein the second axis is perpendicular to the first axis.

4. The impedance match circuit system of claim 1, wherein the top portion includes a radio frequency (RF) strap that extends from the bottom portion, wherein the RF strap is configured to couple a plurality of circuit components housed within the bottom portion with an RF transmission line that is coupled to a plasma chamber, wherein the plurality of circuit components include a plurality of capacitors.

5. The impedance match circuit system of claim 1, wherein the TES match compartment includes a TES match, wherein the TES match includes a plurality of electrical components configured to match an impedance of a load coupled to an output of the TES match with an impedance of a source coupled to an input of the TES match, wherein the output is configured to be coupled to an edge ring within a plasma chamber.

6. The impedance match circuit system of claim 1, wherein the set of helium components is located on an opposite side of the housing compared to a side on which the TES match compartment is located.

7. The impedance match circuit system of claim 1, wherein the set of helium components includes a plurality of conduits configured to supply a coolant gas to a plasma chamber, a power supply configured to supply power to an electric motor to rotate a lower electrode within the plasma chamber, a gap driver configured to modify an amount of gap between the lower electrode and an upper electrode of the plasma chamber, and a plurality of sensors configured to sense one or more variables associated with the impedance matching circuit.

8. A system comprising:
a first housing including an impedance matching circuit, wherein the first housing has a top portion and a bottom portion, wherein the top portion is narrower than the bottom portion;
a tunable edge sheath (TES) match compartment located above the bottom portion and besides the top portion;
a set of helium components located besides the first housing of the impedance matching circuit; and
a radio frequency (RF) generator located above the first housing, wherein the RF generator is configured to generate an RF signal and send the RF signal to the impedance matching circuit.

9. The system of claim 8, wherein the top portion has a first width that is less than a first width of the bottom portion and has a volume that is less than a volume of the bottom portion, wherein the first widths of the top and bottom portions are measured along a first axis.

10. The system of claim 9, wherein the top portion has a second width that is less than a second width of the bottom portion, wherein the second widths of the top and bottom portions are measured along a second axis, wherein the second axis is perpendicular to the first axis.

11. The system of claim 8, wherein the top portion includes an RF strap that extends from the bottom portion, wherein the RF strap is configured to couple a plurality of circuit components housed within the bottom portion with an RF transmission line that is coupled to a plasma chamber, wherein the plurality of circuit components include a plurality of capacitors.

12. The system of claim 8, wherein the TES match compartment includes a TES match, wherein the TES match includes a plurality of electrical components configured to match an impedance of a load coupled to an output of the TES match with an impedance of a source coupled to an input of the TES match, wherein the output is configured to be coupled to an edge ring within a plasma chamber.

13. The system of claim 8, wherein the set of helium components is located on an opposite side of the first housing compared to a side on which the TES match compartment is located.

14. The system of claim 8, wherein the set of helium components includes a plurality of conduits configured to supply a coolant gas to a plasma chamber, a power supply configured to supply power to an electric motor to rotate a lower electrode within the plasma chamber, a gap driver configured to modify an amount of gap between the lower electrode and an upper electrode of the plasma chamber, and a plurality of sensors configured to sense one or more variables associated with the impedance matching circuit.

15. The system of claim 8, further including a second housing, wherein the RF generator is situated on top of the second housing.

16. A system comprising:
a first radio frequency (RF) generator;
a second RF generator;
a first housing located below the first and second RF generators, wherein the first housing includes an impedance matching circuit, wherein the first housing has a top portion and a bottom portion, wherein the top portion is narrower than the bottom portion;
a tunable edge sheath (TES) match compartment located above the bottom portion and besides the top portion;
a set of helium components located besides the first housing of the impedance matching circuit; and
a plasma chamber coupled to the first housing.

17. The system of claim 16, wherein the top portion has a first width that is less than a first width of the bottom portion and has a volume that is less than a volume of the bottom portion, wherein the first widths of the top and bottom portions are measured along a first axis.

18. The system of claim 17, wherein the top portion has a second width that is less than a second width of the bottom portion, wherein the second widths of the top and bottom portions are measured along a second axis, wherein the second axis is perpendicular to the first axis.

19. The system of claim 16, wherein the top portion includes an RF strap that extends from the bottom portion, wherein the RF strap is configured to couple a plurality of circuit components housed within the bottom portion with an RF transmission line that is coupled to the plasma chamber, wherein the plurality of circuit components include a plurality of capacitors.

20. The system of claim 16, wherein the plasma chamber includes an edge ring, wherein the TES match compartment includes a TES match, wherein the TES match includes a plurality of electrical components configured to match an impedance of a load coupled to an output of the TES match with an impedance of a source coupled to an input of the TES match, wherein the output is configured to be coupled to the edge ring within the plasma chamber.

21. The system of claim 16, wherein the set of helium components is located on an opposite side of the first housing compared to a side on which the TES match compartment is located.

22. The system of claim 16, wherein the set of helium components includes a plurality of conduits configured to supply a coolant gas to the plasma chamber, a power supply configured to supply power to an electric motor to rotate a lower electrode within the plasma chamber, a gap driver configured to modify an amount of gap between the lower electrode and an upper electrode of the plasma chamber, and a plurality of sensors configured to sense one or more variables associated with the impedance matching circuit.

23. The system of claim 16, further comprising a second housing, wherein the first and second RF generators are situated on top of the second housing.

* * * * *